United States Patent [19]

Matsuoka

[11] Patent Number: 5,021,868

[45] Date of Patent: Jun. 4, 1991

[54] IC CARRIER

[75] Inventor: Noriyuki Matsuoka, Tokyo, Japan

[73] Assignee: Yamaichi Electric Mfg. Co., Ltd., Tokyo, Japan

[21] Appl. No.: 501,134

[22] Filed: Mar. 29, 1990

[30] Foreign Application Priority Data

Mar. 30, 1989 [JP] Japan ................... 1-79092

[51] Int. Cl.[5] .............. H01L 23/02; H01L 23/12; H01L 23/42; H01L 23/44

[52] U.S. Cl. ......................... 357/74; 357/79; 357/80; 361/392; 174/52.4; 174/52.5

[58] Field of Search .................. 357/74, 79, 80; 174/52.4, 52.5; 361/392, 393

[56] References Cited

U.S. PATENT DOCUMENTS

| | | | |
|---|---|---|---|
| 4,345,267 | 8/1982 | Corman et al. | 357/81 |
| 4,381,131 | 4/1983 | Demnianiuk | 357/79 |
| 4,435,724 | 3/1984 | Ralstin | 357/80 |
| 4,547,794 | 10/1985 | Tang | 357/70 |
| 4,745,456 | 5/1988 | Clemens | 357/79 |
| 4,887,149 | 12/1989 | Romano | 357/81 |

FOREIGN PATENT DOCUMENTS 0278159 12/1986 Japan .................... 357/79

Primary Examiner—Rolf Hille
Assistant Examiner—David Ostrowski
Attorney, Agent, or Firm—Wenderoth, Lind & Ponack

[57] ABSTRACT

An IC carrier has a continuous annular frame formed in a generally square shape, an IC accommodating portion formed with the frame and adapted to accommodate an IC package therein, a supporting portion formed on the frame and adapted to support contact pieces of the IC package, and engaging claws integrally formed on the frame and adapted to hold the IC package. The IC carrier further has a hinge portion formed in corner portions at the ends of a diagonal hinge line extending diametrically of the frame to permit the frame to bend around the hinge line.

4 Claims, 8 Drawing Sheets

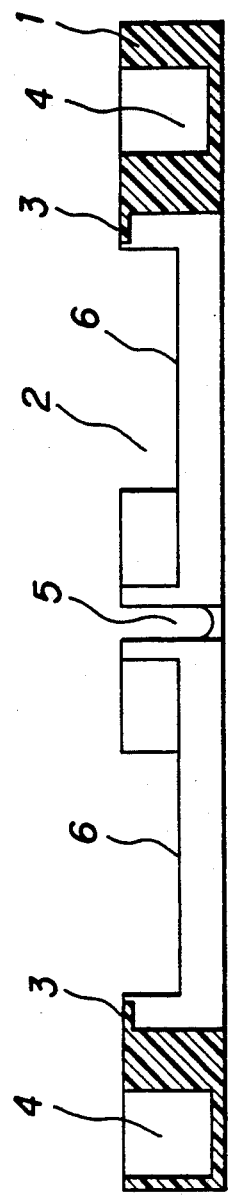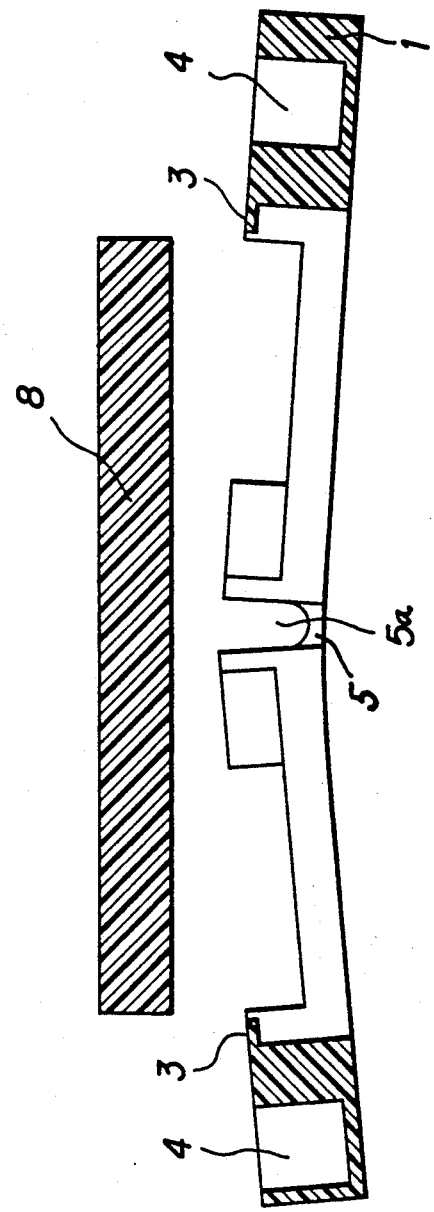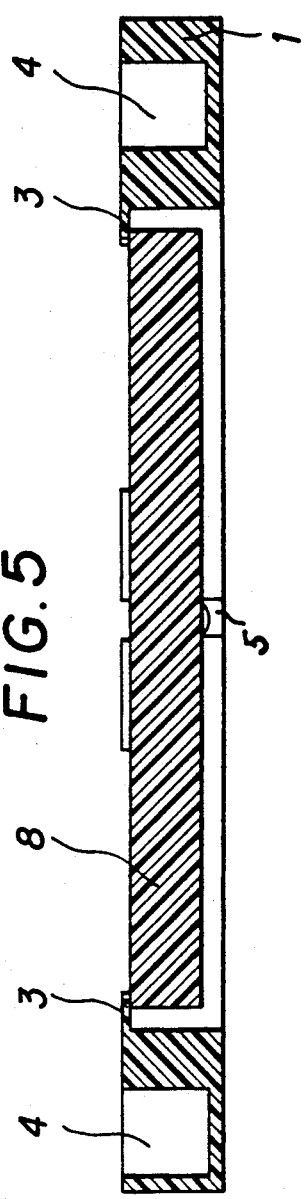

IC CARRIER

BACKGROUND OF THE INVENTION

1. Field of the Invention

This invention relates to an IC carrier used for carrying or measuring an IC package or the like.

2. Brief Description of the Prior Art

A conventional one piece type of IC carrier in which the whole IC carrier is integrally formed of a synthetic resin material comprises an IC package accommodating portion, and a plurality of retaining claws formed in a suitable place on the IC package accommodating portion. By previously forcefully displacing the retaining claws outward or forcefully displacing the retaining claws outward by the push-in force of the IC package, the IC package is loaded. By the restoring force of the retaining claws, the claws are brought into engagement with suitable places of the marginal area of the IC package. In this way, the IC package is carried by the IC carrier.

However, the above-described IC carrier has the following problems. In the conventional IC carrier, the retaining claws are engaged with and disengaged from the IC package by forcefully displacing the retaining claws. It usually requires a considerable amount of force in order to forcefully displace the retaining claws by a required amount. Moreover, careful attention must be paid to the handling of the retaining claws so as not to break the claws. Furthermore, in order to reduce the force, the retaiing claws having an elastic portion must be made thin and thus the production becomes very difficult.

SUMMARY OF THE INVENTION

It is therefore an object of the present invention to provide an IC carrier capable of solving the above-described problems.

In order to achieve this object, in an IC carrier an angular portion on each end of one diagonal line of a generally square frame defining an IC accommodating portion is provided with a hinge portion for enabling bending the frame within the elastic limit of the material of the hinge portion along the diagonal line, thereby to perform engagement and disengagement of the claw and loading and unloading of the IC. The frame is bent or restored to its normal shape on the diagonal line around the hinge portion on each end of one diagonal line in order to cause the engaging claws to be engaged with an disengaged from the IC package thereby to facilitate the loading and unloading of the IC.

Also, the angular portion on each end of one diagonal line of the frame can be provided with the above-described hinge portion and an angular portion on each end of the other diagonal line is provided with the above-described engaging claw so that the engaging claws on the other diagonal line are opened in order to facilitate the loading and unloading of the IC by means of bending of the frame on the above-described one diagonal line. By providing an engaging claw on the angular portion on each end of the other diagonal line, the engaging claw is opened and closed by a large displacing amount by means of bending on the one diagonal line so the engaging claw can be engaged with and disengaged from the IC package.

Likewise, in an IC carrier, a hinge portion for bending an angular portion on a diagonal line of the frame is provided, said angular portion is provided with the above-described engaging claw, and by bending or restoring the angular portion by the hinge portion, engagement and disengagement of the engaging claws are performed with respect to the IC package. By bending and restoring the angular portion on a diagonal line of the frame through the hinge portion, the engaging claw provided on the angular portion is caused to be engaged with the disengaged from the IC package in order to facilitate the loading and unloading of the IC package.

The novel features which are considered characteristic of the present invention are set forth in particular in the appended claims. The invention itself, however, together with additional objects and advantages thereof, will be best understood from the following description of the specific embodiments when read in connection with the accompanying drawings.

BRIEF DESCRIPTION OF THE DRAWINGS

FIGS. 3-5 are sectional views taken along line 3—3 of FIG. 2 for explaining the process of loading an IC package, FIG. 3 showing the frame in a normal state, FIG. 4 showing a bent state of the IC carrier, and FIG. 5 showing a state of holding the IC package;

DETAILED DESCRIPTION OF THE INVENTION

Figure 1:
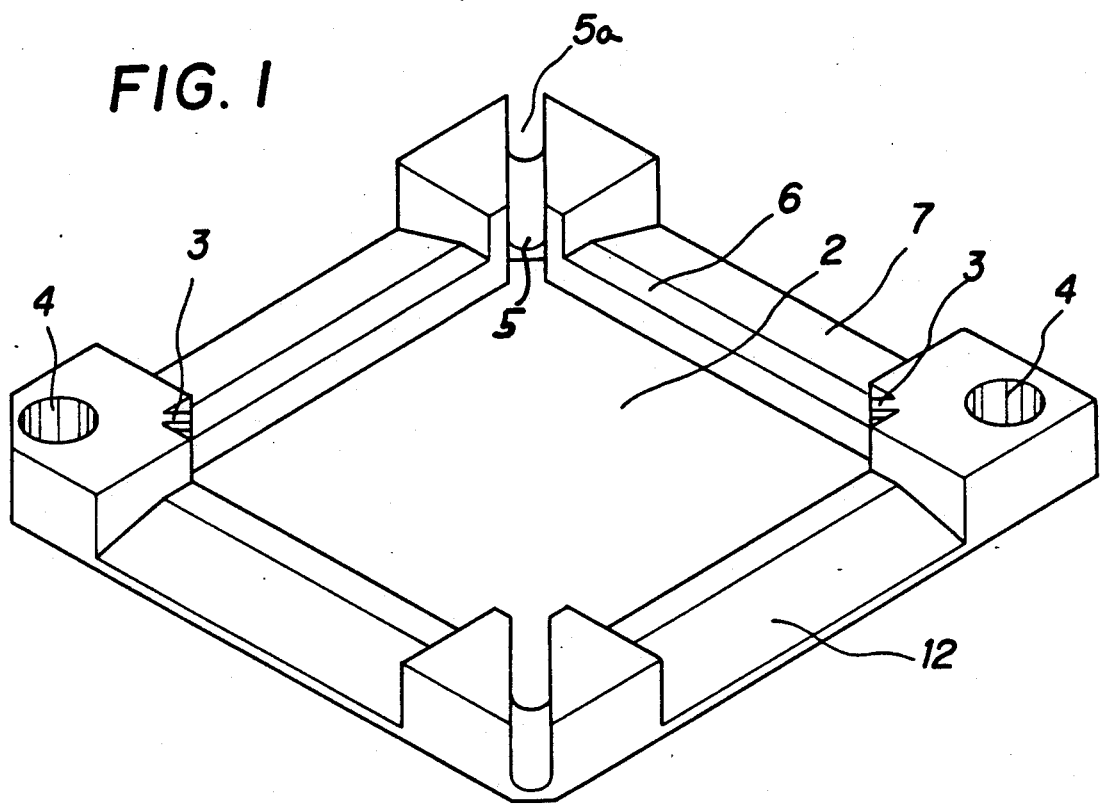
FIG. 1 is a perspective view of an IC carrier showing a first embodiment of the present invention.
Figure 2:
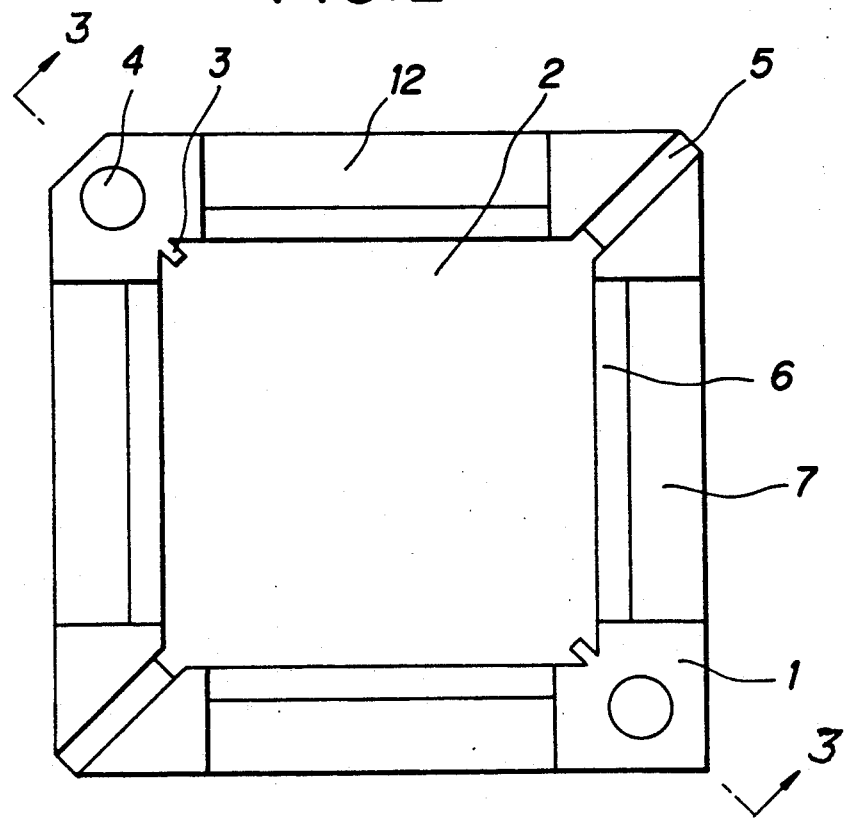
FIG. 2 is a plan view of the IC carrier of FIG. 1.

The embodiments of the present invention wil now be described with reference to FIGS. 1-18.

The reference numeral 1 denotes an IC carrier body, which is formed in the shape of a generally square continuous frame 12. The IC carrier body 1 is provided in its central portion with an IC package accommodating opening portion 2 likewise formed in a generally square shape. The IC carrier body 1 is provided on the angular portion at the corners at each end of one of the diagonal lines, which can be called a hinge line, with a hinge portion 5 by which the IC carrier body 1 can be bent within the elastic limits of the material of the hinge 5, while an angular portion at each end of the other diagonal line, which can be called a non-hinge line, is provided with an engaging claw 3 adapted to engage with a corner of the IC package body 1. Furthermore, the angular portion on the other diagonal line with the engaging claw 3 formed thereon has a pressing force receiving portion 4 such as a hole having a bottom or the like which is located behind the engaging claw 3 and adapted to receive a pressing force when the IC carrier body 1 is bent.

The hinge portion 5, as shown in FIG. 5, is provided by a thin flexible portion at the bottom of a groove 5a formed in the angular portion of the carrier body 1 along the diagonal hinge line, the thin portion having flexibility and being integrally formed with the sides of the groove so that the thin portion can serve as the hinge portion 5.

Figure 6:
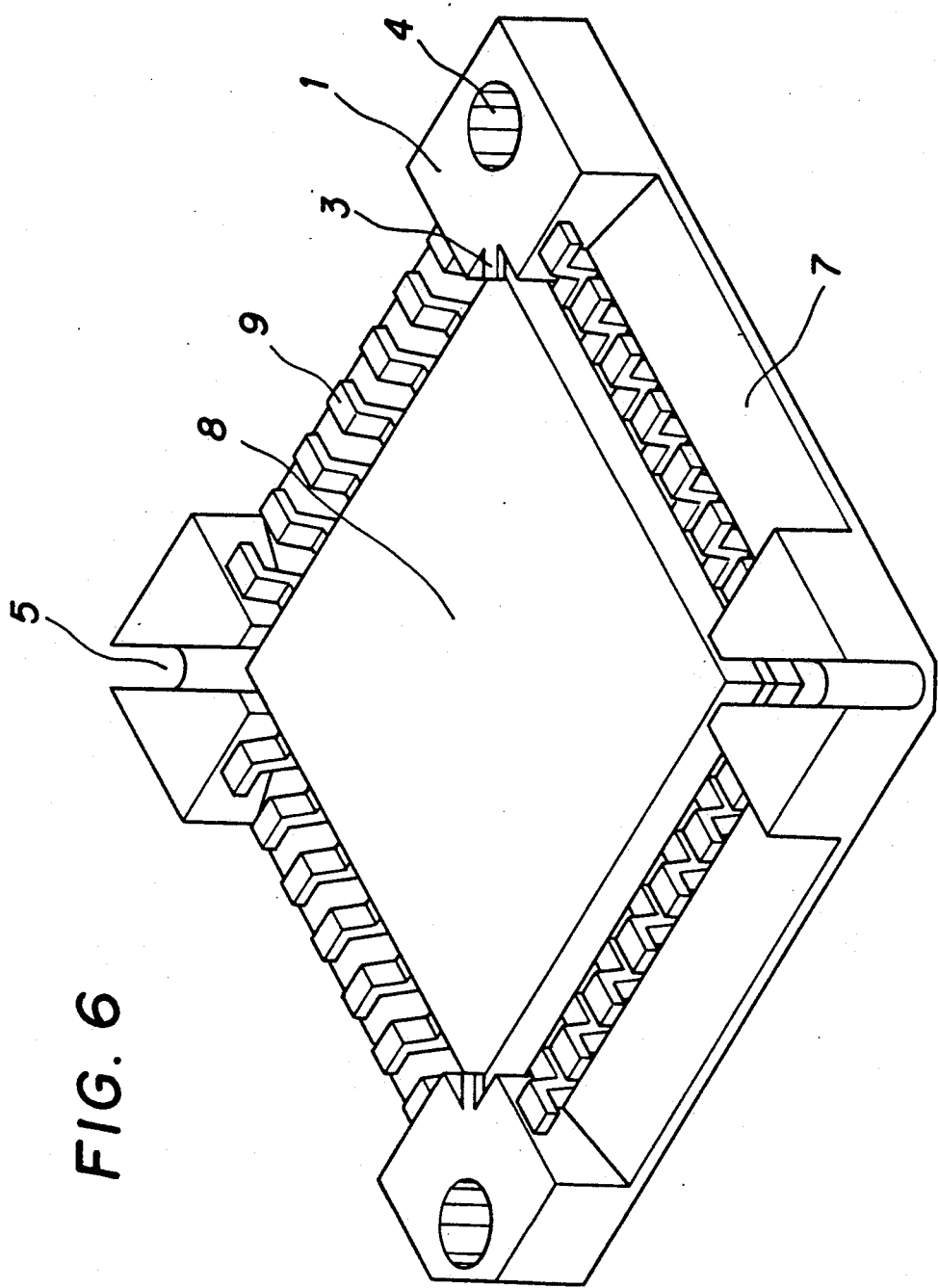
FIG. 6 is a perspective view of the IC carriage holding the IC package.

Also, the four sides of the frame 12 around the generally square IC package accommodating opening portion 2 are each provided with a contact piece supporting seat 6 adapted to support a contact piece 9 of the IC package 8. An outer surface on the outer edge of the contact piece supporting seat 6 has a contact (not shown) of a socket (not shown) interposed therein and is provided with a tapered portion 7 forming a contact space served for contacting the contact piece 9. That is, as is shown in FIG. 6, the contact piece 9 of the IC package 8 is supported by the outer surface on the inner edge side of the contact piece supporting seat 6, an upper end of the contact piece 9 being extended upward and outward above the tapered portion 7 to form a contact space betweeen the tapered portion 7 and the upper end of the contact piece 9.

FIGS. 3–5 are sectional views showing the process for loading an IC package 8 in the IC carrier body 1. First, a pressing force is exerted on the pressing force receiving portions 4 as shown in FIG. 4 to bend the IC carrier body 1 from a normal state shown in FIG. 3 about the hinge portions 5 as supporting points to move the engaging claws 5 apart from each other in order to make the distance therebetween longer than the length of the diagonal non-hinge line of the IC package 8. In this state, when the IC package 8 is put into the IC package accommodating portion 2 and the pressing force is removed, the IC carrier is resiliently bent about the hinge portion 5 back to the normal state as shown in FIGS. 5 and 6, and the separated engaging claws 3 are returned to the original position in order to engage with the angular portions of the IC package 8 so that the same can be held by the IC carrier body 1.

Next, in order to release the IC package 8, a pressing force is again exerted on the pressing force receiving portions 4 to bend the body 1 into a state as shown in FIG. 4 so that the engagement by the retaining claws 3 is released to permit removal of the IC package 8 to be naturally dropped due to its own weight.

Each of the retaining claws 3 is projected inward from the angular portion of the IC carrier body 1 along a diagonal non-hinge line thereof. Also, the engaging claws 3 may be disposed on portions of the opposite two sides of the frame.

Figure 7:
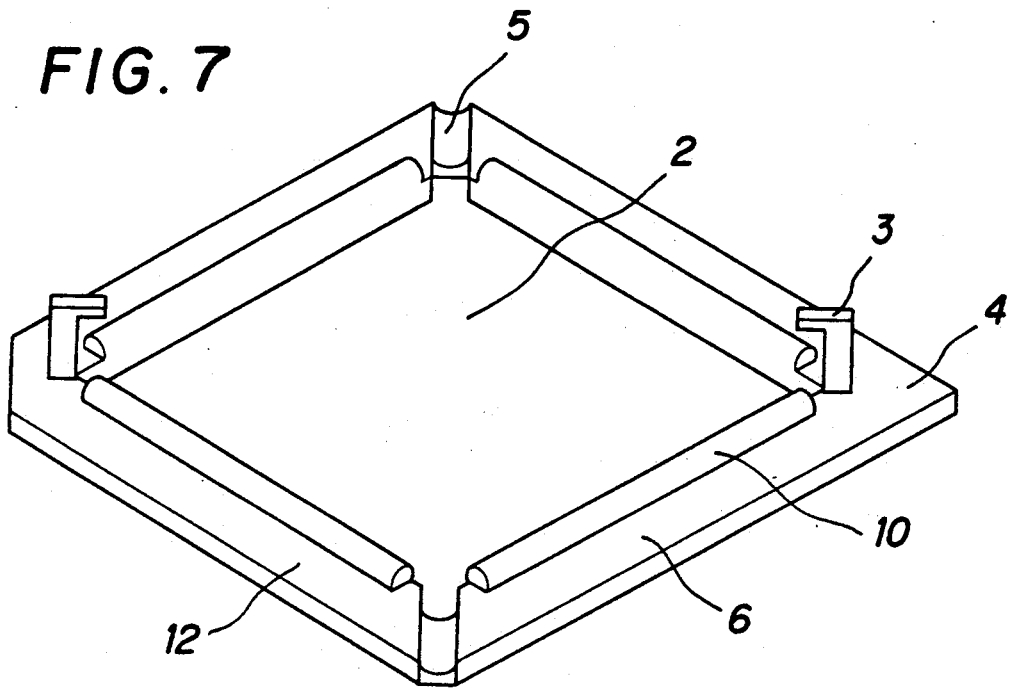
FIG. 7 is a perspective view of an IC carrier showing a second embodiment of the present invention.
Figure 8:
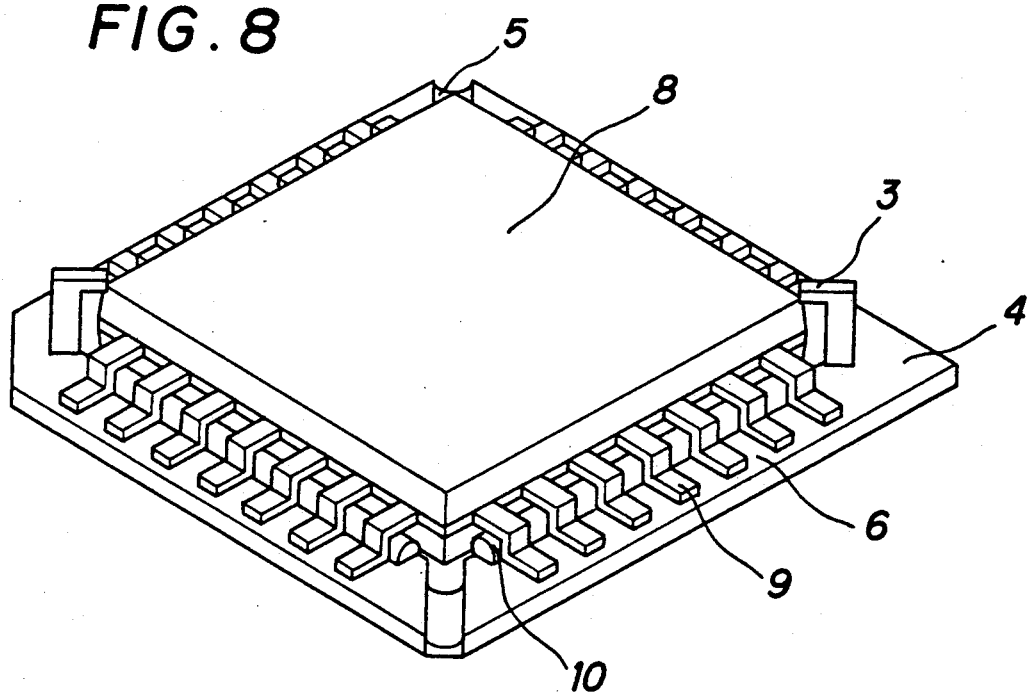
FIG. 8 is a perspective view of an IC package loaded on the IC carrier of FIG. 7.

FIG. 7 shows a second embodiment of the IC carrier of the present invention. Four sides of the frame 12 around the generally square IC package accommodating opening portion 2 formed in its center are provided with positioning projections 10 disposed along the outer surface of the frame and adapted to position both the four side edges of the IC package 8 and the bent portion of the contact pieces 9 or either the four side edges or the bent portion. The IC carrier body 1 is provided with a hook-shaped engaging claw 3 erected from the angular portion at each end of the diagonal non-hinge line of the IC carrier body 1. The IC carrier body 1 is further provided with a flat pressing force receiving portion 4 formed behind each retaining claw 3 or in the vicinity of the angular portion. FIG. 8 is a perspective view showing a state where the IC package is held by the IC carrier 1 of FIG. 7. The IC carrier body 1 is bent to accommodate the IC package 8 around the hinges 5 and restored to cause the engaging claws 3 to be engaged with the edge portions of the package 8. Also, the contact pieces 9 of the IC package 8 are bent downwardly and outwardly and the inner side of the bent portion is supported on the projection 10 so as to be positioned.

Figure 9:
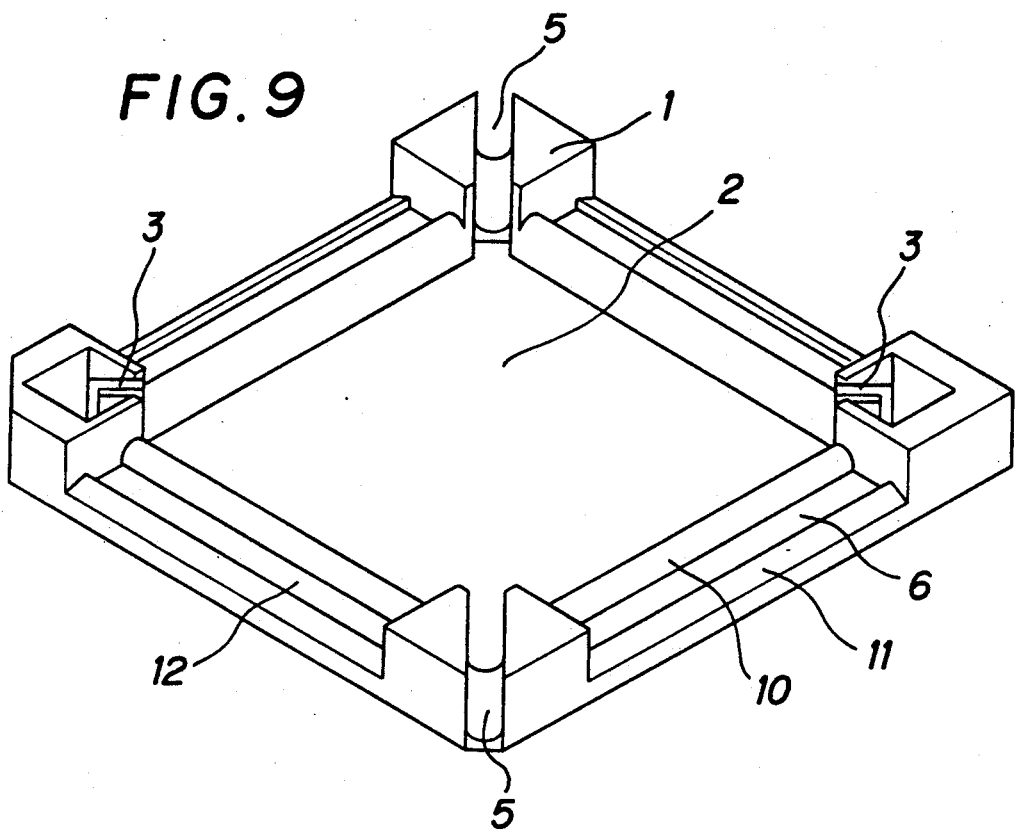
FIG. 9 is a perspective view of an IC carrier showing a third embodiment of the present invention.

FIG. 9 shows a third embodiment of the IC carrier of the present invention. Four sides on the outer edge side of the frame 12 of the IC carrier body 1 are provided with contact guide tapers 11 which are used as guides when the contacts of the package are displaced.

Figure 10:
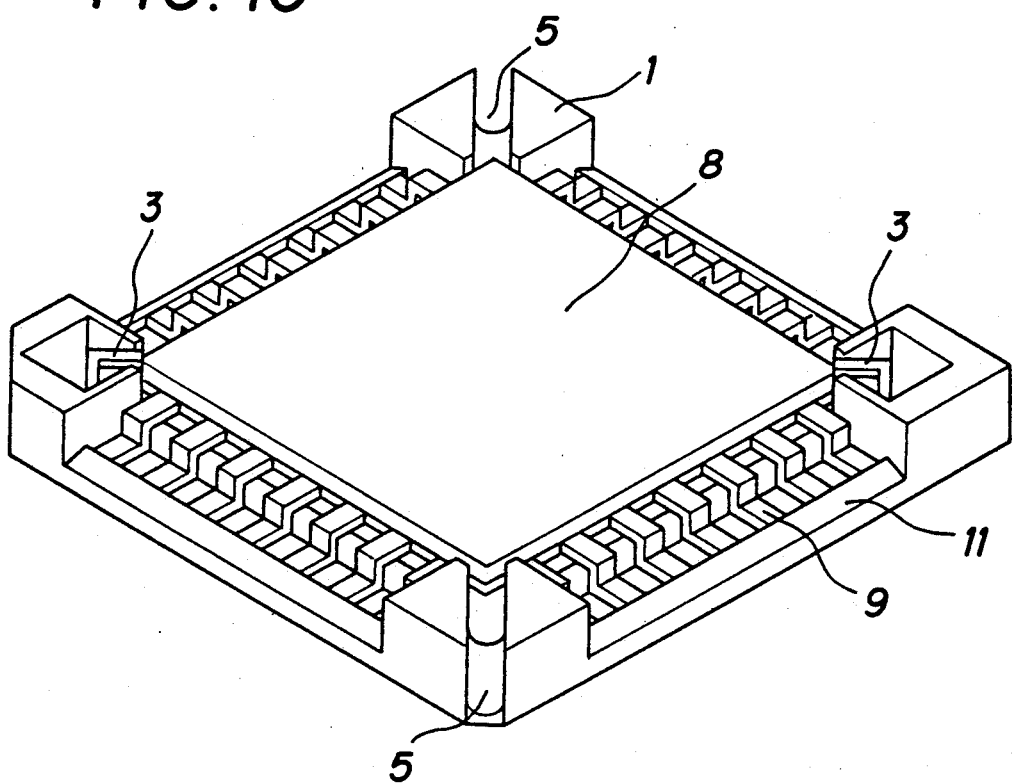
FIG. 10 is a perspective view of an IC package loaded on the IC carrier of FIG. 9.
Figure 11:
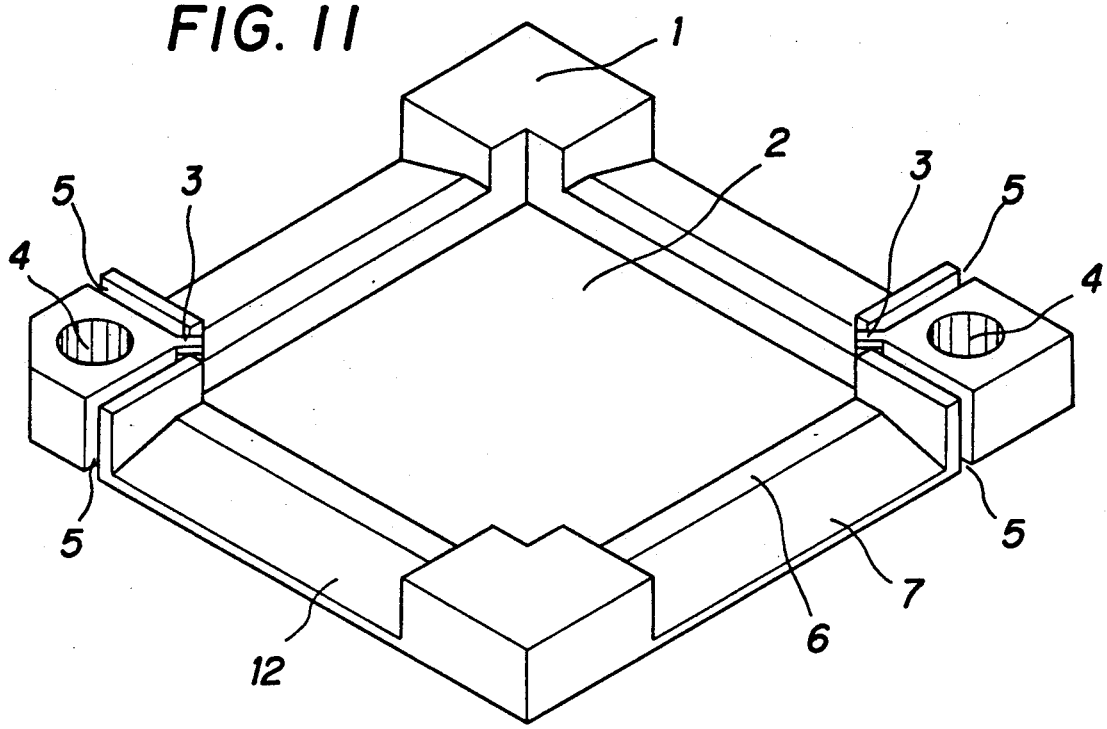
FIG. 11 is a perspective view of an IC carrier showing a fourth embodiment of the present invention.
Figure 12:
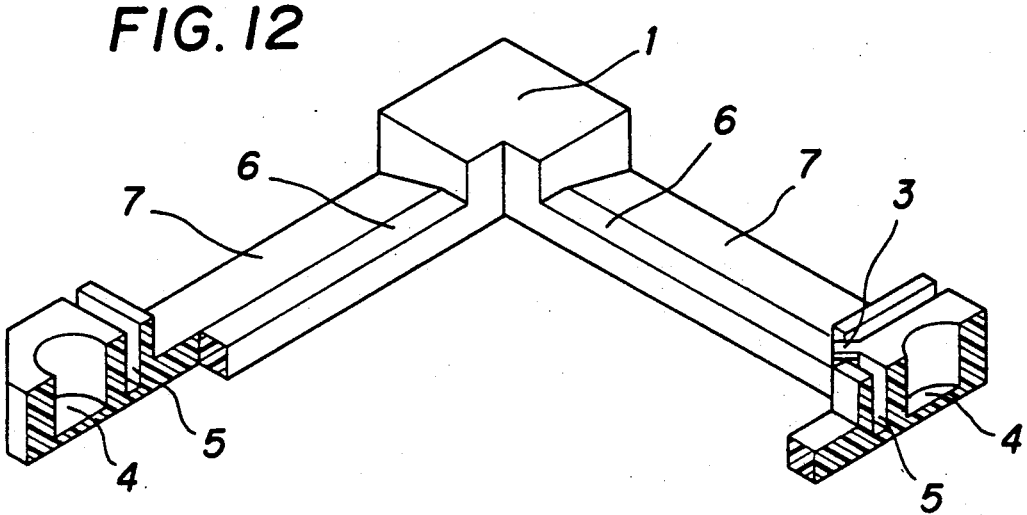
FIG. 12 is a perspective view, partly in section, of the IC carrier of FIG. 13.
Figure 13:
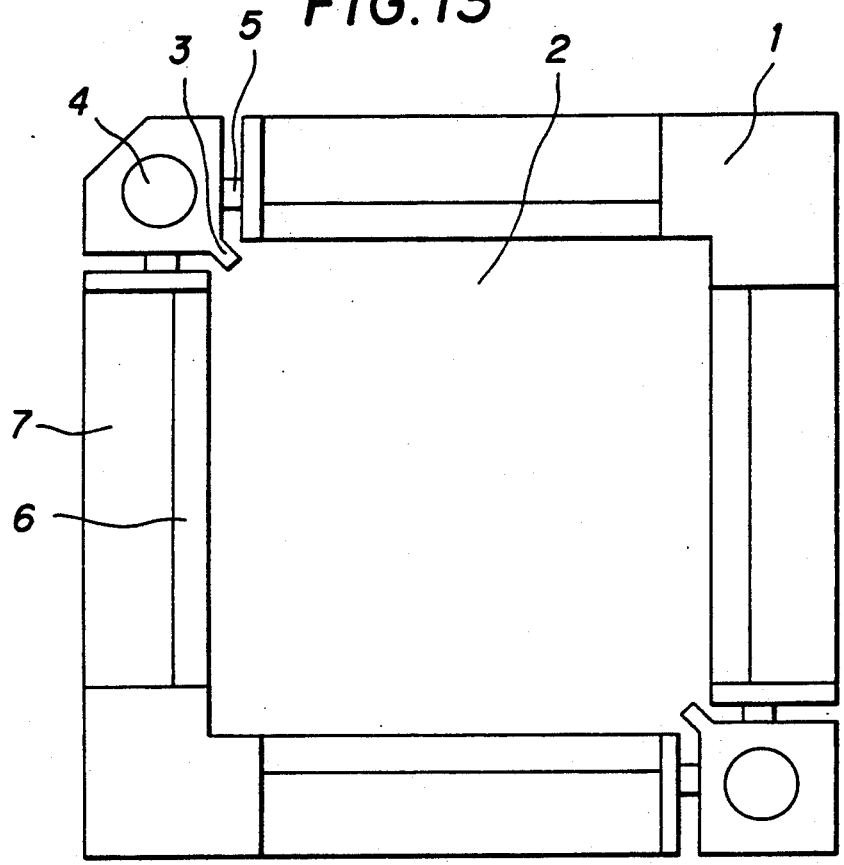
FIG. 13 is a plan view of the IC carrier of FIG. 11.
Figure 15:
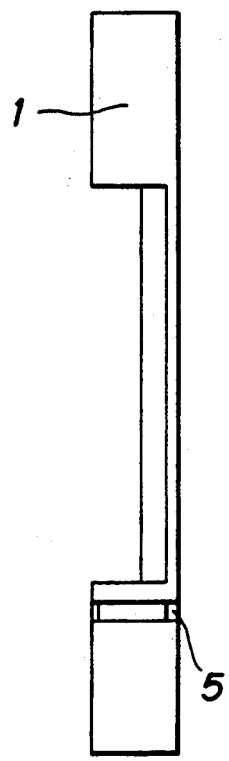
FIG. 15 is a side view of the IC carrier of FIG. 11.
Figure 14:
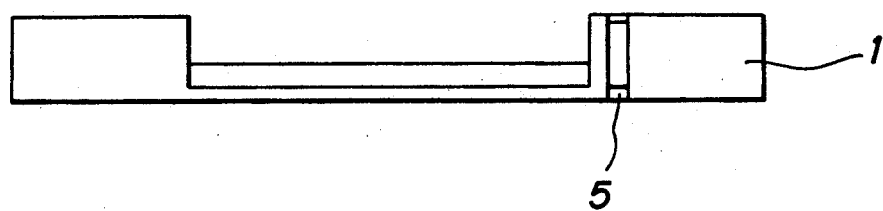
FIG. 14 is a front view of the IC carrier of FIG. 11.

Also, the angular portions on the diagonal non-hinge line are each provided with a hole and the retaining claw 3 is disposed within the hole in such a manner that the tip of the engaging claw 3 is projected inward from the hole. FIG. 10 is a perspective view showing a state where the IC carrier 1 of FIG. 9 has been bent and restored as previously stated so that the IC package 8 is held by the IC carrier 1.

FIGS. 11–14 show a fourth embodiment of the IC carrier of the present invention which has a retaining claw 3 on the angular portion on each end of a diagonal line of the generally square IC carrier body 1 and in which continuous portions between the angular portion and the body of the frame 12 form resilient hinge portions 5 which are thin and bendable. By bending the angular portion provided with the retaining claw 3 thereon around the resilient hinge portions 5, the engaging claws 3 are opened so that the IC package 8 is ready to be accommodated.

Figure 16:
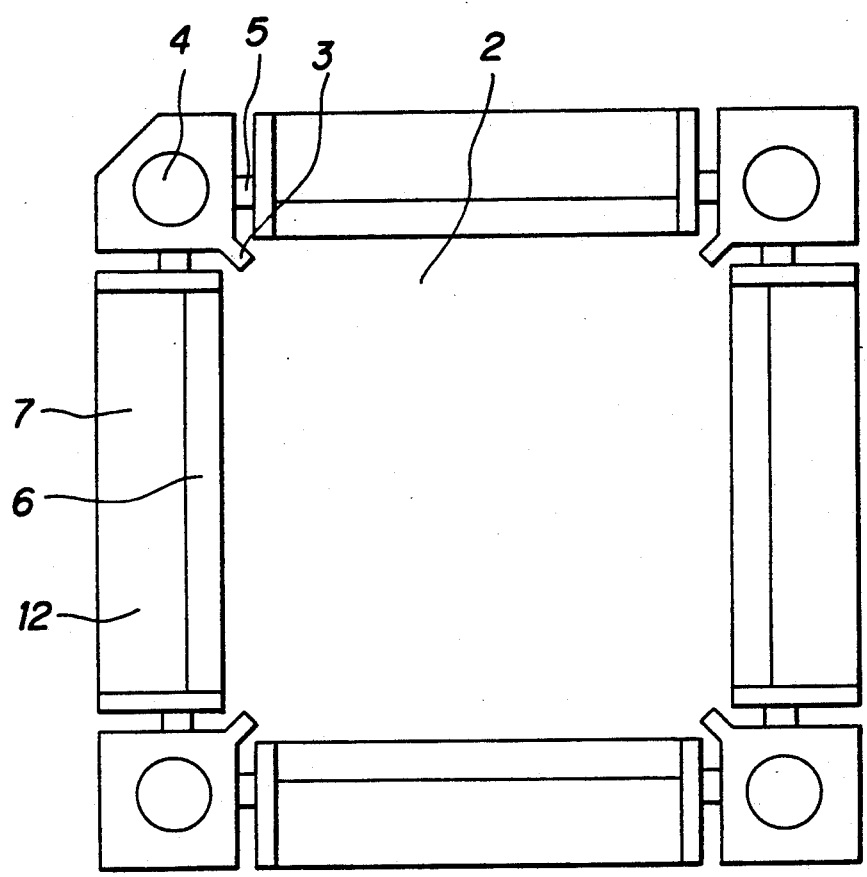
FIG. 16 is a plan view of an IC carrier showing a fifth embodiment of the present invention.
Figure 18:
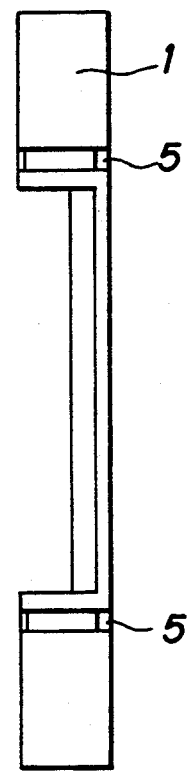
FIG. 18 is a side view of the IC carrier of FIG. 16.
Figure 17:
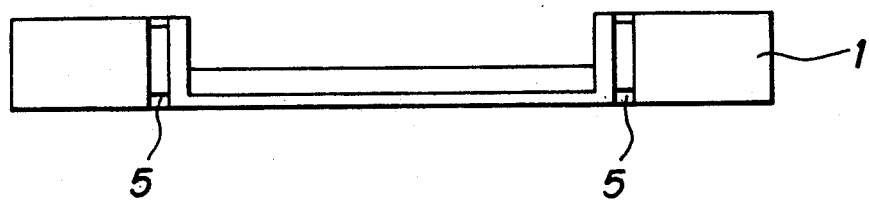
FIG. 17 is a front view of the IC carrier of FIG. 16.

FIGS. 16–18 show a fifth embodiment of the present invention in which four angular portions at the ends of the respective diagonal lines of the IC carrier body are provided with a retaining claw 3 and hinge portions 5 for bending the angular portion.

As described above, in the IC carrier according to the embodiments of FIGS. 1–10, the frame is bent and restored in the diagonal hinge line around the hinge portion provided in the angular portion on the diagonal hinge line of the frame so that the engaging claws formed on the frame are caused to be engaged with and disengaged from the IC package and the IC package can thus be loaded and unloaded.

In this IC carrier, by arranging the hinges at the angular portions at the ends of the diagonal hinge line and the engaging claws on the angular portions at the ends of the other diagonal non-hinge line, the engaging claws are opened and closed by being displaced a large amount in accordance with the bending on said diagonal hinge line and surely engaged and disengaged from the IC package.

Likewise, in the IC carrier of FIGS. 11–18, by bending and restoring the angular portion on the ends of a diagonal line of the frame around hinge portions therefor, the engaging claws provided on the angular portions together with the angular portions are opened and closed by a sufficient amount to properly engage with and disengage from the IC package so that the IC package can be loaded and unloaded.

In each of the above cases, breakage of the engaging claw, as has occurred in the conventional case where the engaging claw itself is forcefully displaced, can be prevented, the opening and closing operation of the engaging claws becomes very easy, and the force for such operation is reduced. Furthermore, as the retaining claw need not be made thin to increase resiliency, productivity by means of integral synthetic resin molding is also improved.

It is to be understood that the forms of the invention herewith shown and described are to be taken as the preferred embodiments of the same, and that various changes and modifications may be resorted to without departing from the spirit of the invention or the scope of the subjoined claims.

What is claimed is:

1. An integrated circuit carrier comprising:
   a continuous annular frame having opposite faces and an opening in the center thereof for accomodating an integrated circuit;
   two diametrically opposed corner portions at the opposite ends of a diagonal hinge line extending diametrically across said frame, said corner portions each having a groove shaped opening therethrough extending along said diagonal hinge line, and each having a thin, flexible hinge portion extending across said groove shaped opening and hingedly joining parts of said corner portions separated by said groove, whereby said frame can be bent around said hinge portions with said diagonal hinge line as an axis of bending; and
   engaging claws integrally formed on said frame on one face thereof and at positions spaced from said corner portions for, when said frame is unbent, engaging an integrated circuit therein for holding the integrated circuit therein, and when said frame is bent around said diagonal hinge line toward the other face, moving away from the position of the integrated circuit for releasing the integrated circuit from said frame.

2. An integrated circuit carrier as claimed in claim 1 in which said engaging claws are at the opposite ends of a further diagonal line across said frame at an angle to said diagonal hinge line.

3. An integrated circuit carrier as claimed in claim 2 in which said frame is generally square in shape, and said diagonal lines extend between the corners of the square shape.

4. An integrated circuit carrier as claimed in claim 3 in which said frame has further corner portions at the opposite ends of said further diagonal line, and said engaging claws are integral with said further corner portions.

* * * * *